United States Patent
Ohara et al.

(10) Patent No.: US 10,222,430 B2
(45) Date of Patent: Mar. 5, 2019

(54) SENSOR DEVICE AND SEMICONDUCTOR DEVICE

(71) Applicants: Tomomitsu Ohara, Tokyo (JP); Yasuaki Aikyo, Tokyo (JP); Tomoyuki Sakurada, Tokyo (JP)

(72) Inventors: Tomomitsu Ohara, Tokyo (JP); Yasuaki Aikyo, Tokyo (JP); Tomoyuki Sakurada, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/443,134

(22) Filed: Feb. 27, 2017

(65) Prior Publication Data

US 2017/0254861 A1 Sep. 7, 2017

(30) Foreign Application Priority Data

Mar. 1, 2016 (JP) ................................. 2016-039137
Feb. 3, 2017 (JP) ................................. 2017-018963

(51) Int. Cl.
*G01R 33/00* (2006.01)
*H03F 3/45* (2006.01)
(Continued)

(52) U.S. Cl.
CPC ......... *G01R 33/0023* (2013.01); *G01R 15/18* (2013.01); *G01R 33/0385* (2013.01);
(Continued)

(58) Field of Classification Search
CPC ............ G01R 33/0023; G01R 33/0385; G01R 15/18; G01R 33/0005; G01R 33/0029;
(Continued)

(56) References Cited

U.S. PATENT DOCUMENTS

| 3,551,832 A | 12/1970 | Graeme |
| 5,652,506 A * | 7/1997 | Sorenson ................ G01R 1/22 324/117 R |
| 5,894,224 A * | 4/1999 | De Jong ............ G01R 31/3173 324/127 |
| 6,177,806 B1 * | 1/2001 | Burghartz ............ G01R 15/148 324/117 H |

(Continued)

FOREIGN PATENT DOCUMENTS

JP       2015-052470       3/2015

OTHER PUBLICATIONS

Jianjun Gao: "1/f Low-Frequency Noise" In: "RF and Microwave Modeling and Measurement Techniques for Field Effect Transistors", Jan. 1, 2010, ProQuest Ebook Central, XP055399154, ISBN: 978-1-891121-89-0 pp. 101-103.
Jiri Dostal: "Internal Input-Bias-Current Cancellation" In: "Operational Amplifiers", Sep. 24, 1993, Elsevier Science, XP055399152, ISBN: 978-0-7506-9317-2 pp. 65-66.
Extended European search report for European Patent Application No. 17158403.0 dated Aug. 30, 2017.

*Primary Examiner* — Lee Rodak
(74) *Attorney, Agent, or Firm* — IPUSA, PLLC

(57) ABSTRACT

A sensor device is provided including: an electric wire; a semiconductor device including an inductor and an amplifier, the inductor being configured to detect a magnetic field generated around the electric wire, the amplifier including a bipolar element configured to amplify a voltage generated at the inductor; and a substrate on which the first semiconductor device and the electric wire are arranged such that the first semiconductor device is apart from the electric wire by at least a given distance. In a plan view of the substrate, the electric wire does not overlap the first semiconductor device.

6 Claims, 6 Drawing Sheets

(51) Int. Cl.
  *H01L 25/16* (2006.01)
  *H01L 23/522* (2006.01)
  *H01L 23/29* (2006.01)
  *G01R 15/18* (2006.01)
  *G01R 33/038* (2006.01)

(52) U.S. Cl.
  CPC ........ *H01L 23/293* (2013.01); *H01L 23/5227* (2013.01); *H01L 25/16* (2013.01); *H03F 3/45174* (2013.01); *G01R 33/0005* (2013.01); *G01R 33/0029* (2013.01); *H03F 2200/294* (2013.01); *H03F 2203/45212* (2013.01)

(58) Field of Classification Search
  CPC .. G01R 15/181; G01R 15/148; G01R 19/009; H01L 23/293; H01L 25/16; H01L 23/5227; H01L 2924/00014; H03F 3/45174; H03F 2203/45212; H03F 2200/294
  See application file for complete search history.

(56) References Cited

U.S. PATENT DOCUMENTS

| | | |
|---|---|---|
| 8,564,372 B2 | 10/2013 | Saito |
| 2006/0066408 A1 | 3/2006 | Fang et al. |
| 2006/0202699 A1* | 9/2006 | Reiderman ............... G01V 3/28 324/339 |
| 2009/0001962 A1* | 1/2009 | Dupuis ................ G01R 15/181 324/117 R |
| 2012/0146620 A1* | 6/2012 | Dames ................. G01R 15/181 324/76.11 |
| 2015/0061645 A1 | 3/2015 | Nemoto et al. |
| 2015/0061660 A1 | 3/2015 | Nemoto et al. |
| 2016/0231364 A1* | 8/2016 | Nejatali ............. G01R 19/0092 |
| 2017/0006667 A1* | 1/2017 | Anton Falcon ...... G01R 15/181 |
| 2018/0019053 A1* | 1/2018 | Ichikawa ............ H01F 27/2804 |

* cited by examiner

SENSOR DEVICE AND SEMICONDUCTOR DEVICE

CROSS-REFERENCE TO RELATED APPLICATIONS

The present application claims priority under 35 U.S.C. § 119 to Japanese Patent Application No. 2016-039137 filed on Mar. 1, 2016, and Japanese Patent Application No. 2017-018963 filed on Feb. 3, 2017, the entire contents of which are incorporated herein by reference.

BACKGROUND OF THE INVENTION

1. Field of the Invention

The present disclosure generally relates to sensor devices and semiconductor devices.

2. Description of the Related Art

A sensor device including a power line that is disposed between two inductors respectively arranged in semiconductor devices has conventionally been known. Such a sensor device adds electromotive forces generated at the two inductors by a magnetic field generated around the power line, and detects an electric current flowing in the power line, as described in Japanese Laid-open Patent Publication No. 2015-52470, for example. According to Japanese Laid-open Patent Publication No. 2015-52470, sensitivity of the sensor device (specifically, sensitivity in detecting a change in the magnetic field generated around the power line) can be improved by shortening the distances between the power line and the two inductors respectively arranged in the semiconductor devices.

In a case where the distances between the power line and the two inductors are shortened as described in Japanese Laid-open Patent Publication No. 2015-52470, however, electric field noise emitted from the power line is easily input into the two inductors. Hence, the sensor device might be affected.

SUMMARY OF THE INVENTION

An object of the present disclosure is to provide a sensor device and a semiconductor device that are less likely to be affected by the electric field noise emitted from an electric wire such as a power line.

In one embodiment, a sensor device is provided including: an electric wire; a semiconductor device including an inductor and an amplifier, the inductor being configured to detect a magnetic field generated around the electric wire, the amplifier including a bipolar element configured to amplify a voltage generated at the inductor; and a substrate on which the first semiconductor device and the electric wire are arranged such that the first semiconductor device is apart from the electric wire by at least a given distance. In a plan view of the substrate, the electric wire does not overlap the first semiconductor device.

In one embodiment, it is possible to provide a sensor device and a semiconductor device that are less likely to be affected by the electric field noise emitted from an electric wire such as a power line.

DESCRIPTION OF THE PREFERRED EMBODIMENTS

In the following, embodiments of the present disclosure will be described with reference to the accompanying drawings.

First Embodiment

Figure 1:
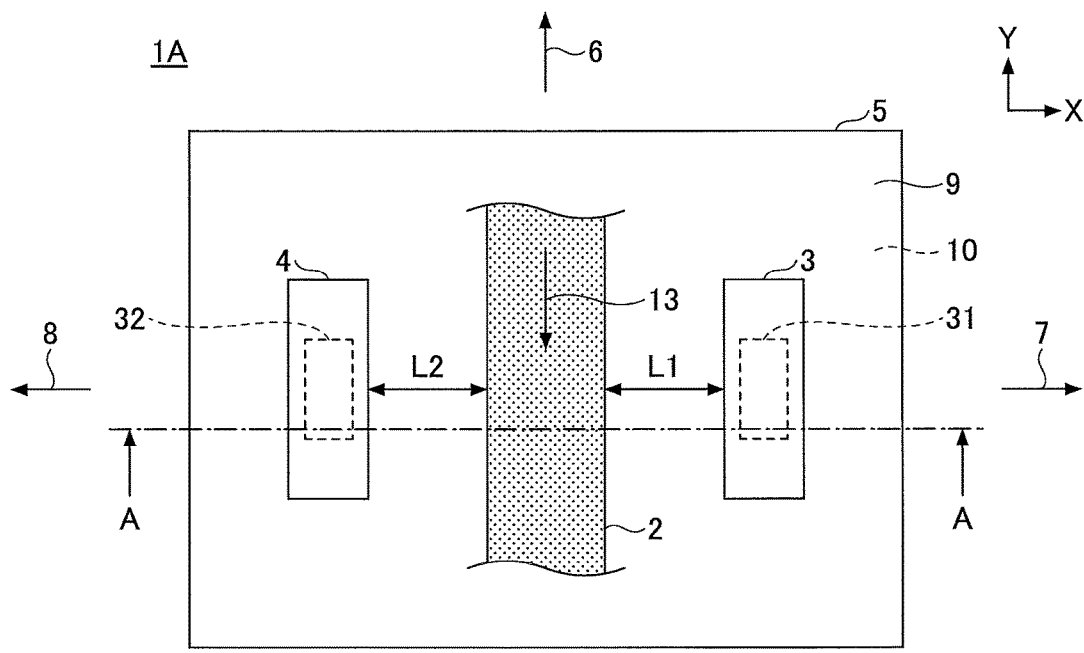
FIG. 1 is a schematic plan view of one example of a configuration of a sensor device.
Figure 2:
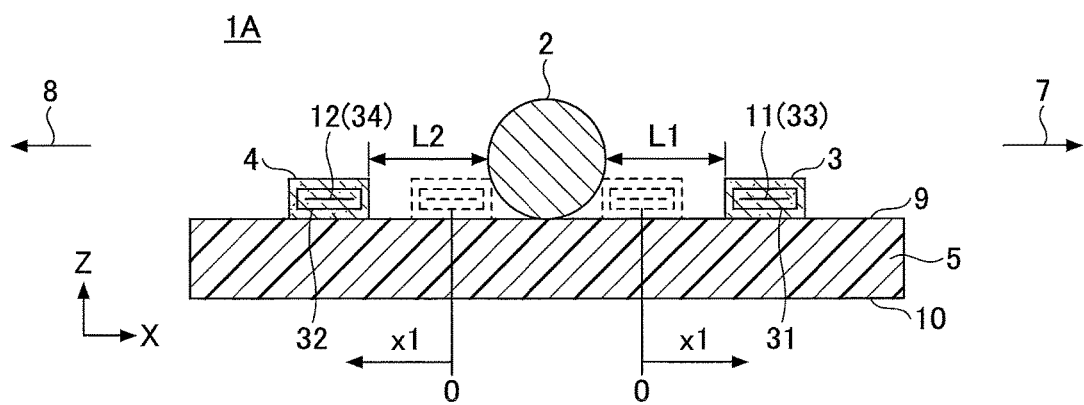
FIG. 2 is a cross-sectional view of one example of the configuration of the sensor device.

FIG. 1 is a schematic plan view of one example of a configuration of a sensor device 1A in a first embodiment. FIG. 2 is a cross-sectional view taken along the line A-A of the sensor device 1A. The sensor device 1A is one example of a sensor device configured to detect in a noncontact manner a density of magnetic flux generated by an electric current 13 flowing in an electric current wire 2. The sensor device 1A includes, for example, the electric current wire 2, a first semiconductor device 3, a second semiconductor device 4, and a substrate 5.

The electric current wire 2 may be a conductor through which the electric current 13 flows. The electric current 13 may be an alternating current. The electric current wire 2 is disposed between the first semiconductor device 3 and the second semiconductor device 4 without contacting either the first semiconductor device 3 or the second semiconductor device 4, in a plan view of the substrate 5 (e.g., when the surface of the substrate 5 is viewed in the normal direction of a first surface 9 of the substrate 5). In a case where the first surface 9 of the substrate 5 is parallel to X-Y plane, the normal direction of the first surface 9 corresponds to a direction parallel to Z axis. The electric current wire 2 may be a member disposed in parallel to Y axis along the first surface 9 of the substrate 5, for example.

A circular cross-sectional shape of the electric current wire 2 is illustrated in the drawings, but the electric current wire 2 may have any shape other than such a circular shape (e.g., polygonal shape). The electric current wire 2 that is illustrated is in contact with the first surface 9 of the substrate 5, but electric current wire 2 may be a conductive pattern formed at the surface of the substrate 5, may be a conductive pattern formed in the inside of the substrate 5, or may be an electric wire portion separated from the substrate 5.

The first semiconductor device 3 accommodates a first semiconductor chip 31 in a resin package. The first semiconductor chip 31 includes a first wiring layer 33 in which a first inductor 11 is formed. In other words, the first semiconductor device 3 is one example of a first semiconductor device that accommodates the first wiring layer 33 in which the first inductor 11 configured to detect a magnetic field generated around the electric current wire 2 is formed. The first semiconductor device 3 is arranged on a first direction 7 side of the electric current wire 2. The first direction 7 is perpendicular to a direction where the electric current wire 2 is disposed (i.e., disposed direction 6).

The second semiconductor device 4 accommodates a second semiconductor chip 32 in a resin package. The second semiconductor chip 32 includes a second wiring layer 34 in which a second inductor 12 is formed. In other words, the second semiconductor device 4 is one example of a second semiconductor device that accommodates the second wiring layer 34 in which the second inductor 12 configured to detect the magnetic field generated around the electric current wire 2 is formed. The second semiconductor device 4 is arranged on a second direction 8 side of the electric current wire 2. The second direction 8 is perpendicular to the disposed direction 6 in which the electric current wire 2 is disposed. The second direction 8 is an opposite direction to the first direction 7. The second semiconductor device 4 may have the same configuration as the first semiconductor device 3.

The first wiring layer 33 may include one or more wiring layers. For example, the first inductor 11 may be a helical coil including one wiring layer, or may be a helical coil including a plurality of wiring layers. The first wiring layer 33 may be, for example, an aluminum wiring layer in which one or more aluminum wirings are formed. The second wiring layer 34 and the second inductor 12 may have the same configurations as the first wiring layer 33 and the first inductor 11, respectively.

The first inductor 11 is configured to detect a change in the magnetic field generated by the electric current 13 flowing in the electric current wire 2. A voltage is produced at the first inductor 11 by such a change in the magnetic field. Values of the voltages generated at both ends of the first inductor 11 become higher, as a value of the electric current 13 is higher. The second inductor 12 may operate in the same manner as the first inductor 11. By equalizing the inductance between the first inductor 11 and the second inductor 12, it is possible to reduce detection errors in detecting the density of magnetic flux generated by the electric current 13.

The substrate 5 has the first surface 9 and a second surface 10 that is an opposite side of the first surface 9. The substrate 5 may be a resin substrate such as a printed wiring substrate, for example. In FIG. 1 and FIG. 2, the first and second semiconductor devices 3 and 4 are arranged on an identical surface of the substrate 5, and the electric current wire 2 is also arranged on such an identical surface. More specifically, the first and second semiconductor devices 3 and 4 are mounted on the first surface 9 of the substrate 5.

The first and second semiconductor devices 3 and 4 are arranged on the substrate 5 to be individually apart from the electric current wire 2 by at least a given distance (hereinafter, referred to as a "distance L0"). The distance L0 is longer than zero.

The fact that the first semiconductor device 3 is apart from the electric current wire 2 by at least the given distance L0 means that a shortest distance L1 between the first semiconductor device 3 and the electric current wire 2 is equal to or longer than the distance L0. The fact that the second semiconductor device 4 is apart from the electric current wire 2 by at least the given distance L0 means that a shortest distance L2 between the second semiconductor device 4 and the electric current wire 2 is equal to or longer than the distance L0.

The shortest distance L1 is the shortest distance between a package surface of the first semiconductor device 3 and a surface of the electric current wire 2. Since the first inductor 11 is accommodated in the package of the first semiconductor device 3, the shortest distance between a surface of the first inductor 11 and a surface of the electric current wire 2 is longer than the shortest distance L1. Similarly, the shortest distance L2 is the shortest distance between a package surface of the second semiconductor device 4 and the surface of the electric current wire 2. Since the second inductor 12 is accommodated in the package of the second semiconductor device 4, the shortest distance between a surface of the second inductor 12 and the surface of the electric current wire 2 is longer than the shortest distance L2.

By equalizing the shortest distance L1 and the shortest distance L2, it is possible to reduce the detection errors in detecting the density of magnetic flux generated by the electric current 13.

In the first embodiment, the first and second semiconductor devices 3 and 4 are arranged to be individually apart from the electric current wire 2 by at least the given distance L0. This configuration makes the sensor device 1A less likely to be affected by the electric field noise emitted from the electric current wire 2 to which a high voltage has been applied, while securing the sensitivity in detecting the magnetic field generated around the electric current wire 2. In a case where the first semiconductor device 3 (or the second semiconductor device 4) is arranged at a position that the distance between the first semiconductor device 3 (or the second semiconductor device 4) and the electric current wire 2 is shorter than the distance L0, a high voltage caused by the electric field noise is applied between the package of the first semiconductor device 3 (or the second semiconductor device 4) and the electric current wire 2. The sensor device 1A is more likely to be affected by the electric field noise.

Figure 8:
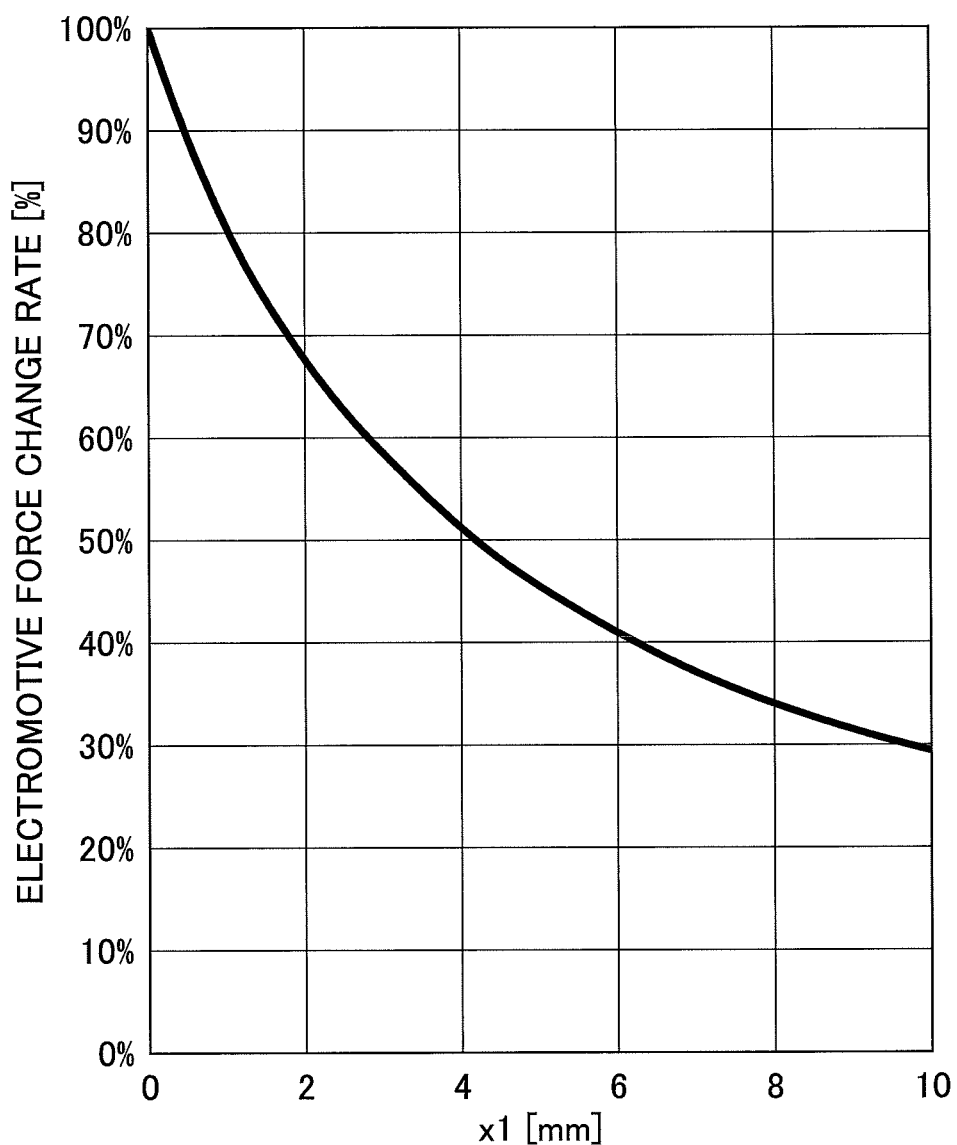
FIG. 8 is a graph of one example of a relationship between an electromotive force change rate and a distance in X-axis direction between the semiconductor device and an electric wire.

FIG. 8 is a graph of one example of a relationship between an electromotive force change rate and a distance in X-axis direction between the electric current wire 2 and the semiconductor device 3 or 4. In FIG. 2 and FIG. 8, x1 represents the distance in X-axis direction between the electric current wire 2 and each of the semiconductor devices 3 and 4. The X-axis direction represents a direction parallel to the first and second directions 7 and 8. In a case where x1 is 0, the first semiconductor device 3 and the electric current wire 2 are in contact with each other, and the second semiconductor device 4 and the electric current wire 2 are in contact with each other (i.e., the shortest distances L1 and L2 are both 0). In a case where x1 takes a value larger than 0, the first and second semiconductor devices 3 and 4 are both apart from the electric current wire 2 by the same distance in X-axis direction. In such a case where x1 takes the value larger than 0, the electric current wire 2 does not overlap the first semiconductor device 3 or the second semiconductor device 4, in a plan view of the substrate 5. Additionally, the electromotive force change rate on the vertical axis of FIG. 8 represents a change rate of an electromotive force Vcoil generated between both ends of the first inductor 11 with respect to the distance x1. In a case where the distance x1 is 0, the electromotive force change rate is assumed to be 100%.

Note that FIG. 8 represents theoretical values of the electromotive force change rate with respect to the distance x1, when a wire diameter of the electric current wire 2 is 3 millimeters. Additionally, it is assumed that the electromotive force Vcoil generated between both ends of the first inductor 11 is the same as electromotive force Vcoil generated between both ends of the second inductor 12.

The electromotive force Vcoil generated between both ends of the first inductor 11 can be represented by the following expressions according to Faraday's law.

$$Vcoil = -N \times \frac{\Delta \varphi}{\Delta t}$$

$$\varphi = B \times S$$

$$B = \mu_0 \times H$$

$$H = \frac{I}{2\pi r}$$

$$I = A \times \sin \omega t$$

$$\omega = 2\pi f$$

$$\Rightarrow Vcoil = -N \times S \times \frac{\mu_0 I}{2\pi r} \times 2\pi \times f \times \cos \omega t$$

N represents the number of windings of the first inductor 11, φ represents the magnetic flux, t represents time, B represents the density of magnetic flux, S represents an area on X-Y plane of the first inductor 11, $\mu_0$ represents vacuum magnetic permeability, H represents an intensity of the magnetic field generated around the electric current wire 2, I represents a current value of the electric current 13 flowing alternatingly in the electric current wire 2, r represents the distance between the first inductor 11 and the electric current wire 2, A represents amplitude of the electric current 13, ω represents an angular velocity, and f represents a frequency.

The electric field noise received by the semiconductor device 3 or 4 is proportional to one divided by the distance (between a generation source of the electric field noise and the semiconductor device 3 or 4) squared. Specifically, as the distance x1 is longer, the electric field noises respectively input into the first and second inductors 11 and 12 of the semiconductor devices 3 and 4 are smaller. Thus, the semiconductor devices 3 and 4 are less likely to be affected by the electric field noise. In contrast, the electromotive force Vcoil is inversely proportional to the distance x1, as indicated by the above expressions and FIG. 8. Therefore, as the distance x1 becomes longer, the electromotive force Vcoil becomes smaller.

In the semiconductor devices 3 and 4 used in the sensor device 1A, however, bipolar elements are used for amplifying the electromotive forces Vcoil, and thus are capable of weakening the flicker noise, as will be described later. Therefore, in one embodiment, even when the electromotive forces Vcoil are made smaller by making each of the semiconductor devices 3 and 4 apart from the electric current wire 2 by at least the given distance L0 (e.g., 3 millimeters), it is possible to eliminate or reduce possibility that the electromotive force Vcoil cannot be detected correctly due to the existence of flicker noise.

In one or more embodiments, the first and second inductors 11 and 12 are accommodated in different semiconductor devices, instead of being accommodated in an identical semiconductor device. This configuration enables individual layouts of the first and second semiconductor devices 3 and 4, respectively, in a first arrangement direction of the first semiconductor device 3 on the substrate 5 and in a second arrangement direction of the semiconductor device 4 on the substrate 5, while maintaining each of the first and second semiconductor devices 3 and 4 apart from the electric current wire 2 by at least the given distance L0. For example, a longer side of the first semiconductor device 3 can be arranged in parallel to the disposed direction 6 of the electric current wire 2, and a longer side of the second semiconductor device 4 can be arranged in a direction perpendicular to the disposed direction 6 of the electric current wire 2.

Second Embodiment

Figure 3:
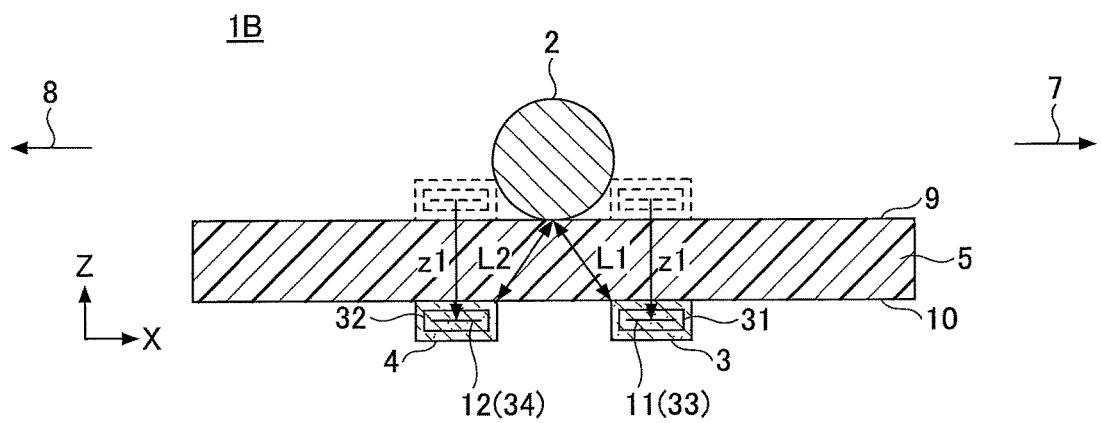
FIG. 3 is a cross-sectional view of another example of the configuration of the sensor device.

FIG. 3 is a cross-sectional view of a sensor device 1B in a second embodiment. The electric current wire 2 is disposed between the first semiconductor device 3 and the second semiconductor device 4 without contacting either the first semiconductor device 3 or the second semiconductor device 4, in a plan view of the substrate 5 (e.g., when the surface of the substrate 5 is viewed in the normal direction of the first surface 9 of the substrate 5). Regarding the configurations and advantages of the sensor device 1B that are same in configurations and advantages as the sensor device 1A, the above-described configurations and advantages of the sensor device 1A are applicable to the sensor device 1B in the second embodiment.

In the sensor device 1B, the electric current wire 2 is arranged on the first surface 9 of the substrate 5, whereas the first and second semiconductor devices 3 and 4 are arranged on the second surface 10 of the substrate 5. Also in the sensor device 1B, each of the first and second semiconductor devices 3 and 4 is apart from the electric current wire 2 by at least the given distance L0. In the sensor device 1B, the first and second semiconductor devices 3 and 4 are arranged on an opposite side of the electric current wire 2 with respect to the substrate 5, such that the substrate 5 is interposed between the electric current wire 2 and the first and second semiconductor devices 3 and 4. Accordingly, the substrate 5 enables the first and second semiconductor devices 3 and 4 to be insulated from the electric field noise emitted from the electric current wire 2. Consequently, the sensor device 1B is less likely to be affected by the electric field noise.

In the sensor device 1B illustrated in FIG. 3, in a plan view of the substrate 5, the electric current wire 2 does not overlap the semiconductor device 3 or the semiconductor device 4. However, in the case where each of the semiconductor devices 3 and 4 is apart from the electric current wire 2 by at least the given distance L0, even when the surface of the substrate 5 is viewed through from the front side of the substrate 5 and the electric current wire 2 overlaps any one of the semiconductor device 3 or the semiconductor device 4, the semiconductor device 1B is less likely to be affected by the electric field noise. This is because the distance between the electric current wire 2 and each of the semiconductor devices 3 and 4 can be separated by at least a thickness of the substrate 5. For example, in FIG. 3, at least one of the semiconductor device 3 or the semiconductor device 4 may be arranged immediately below the electric current wire 2 to interpose the substrate 5.

Figure 9:
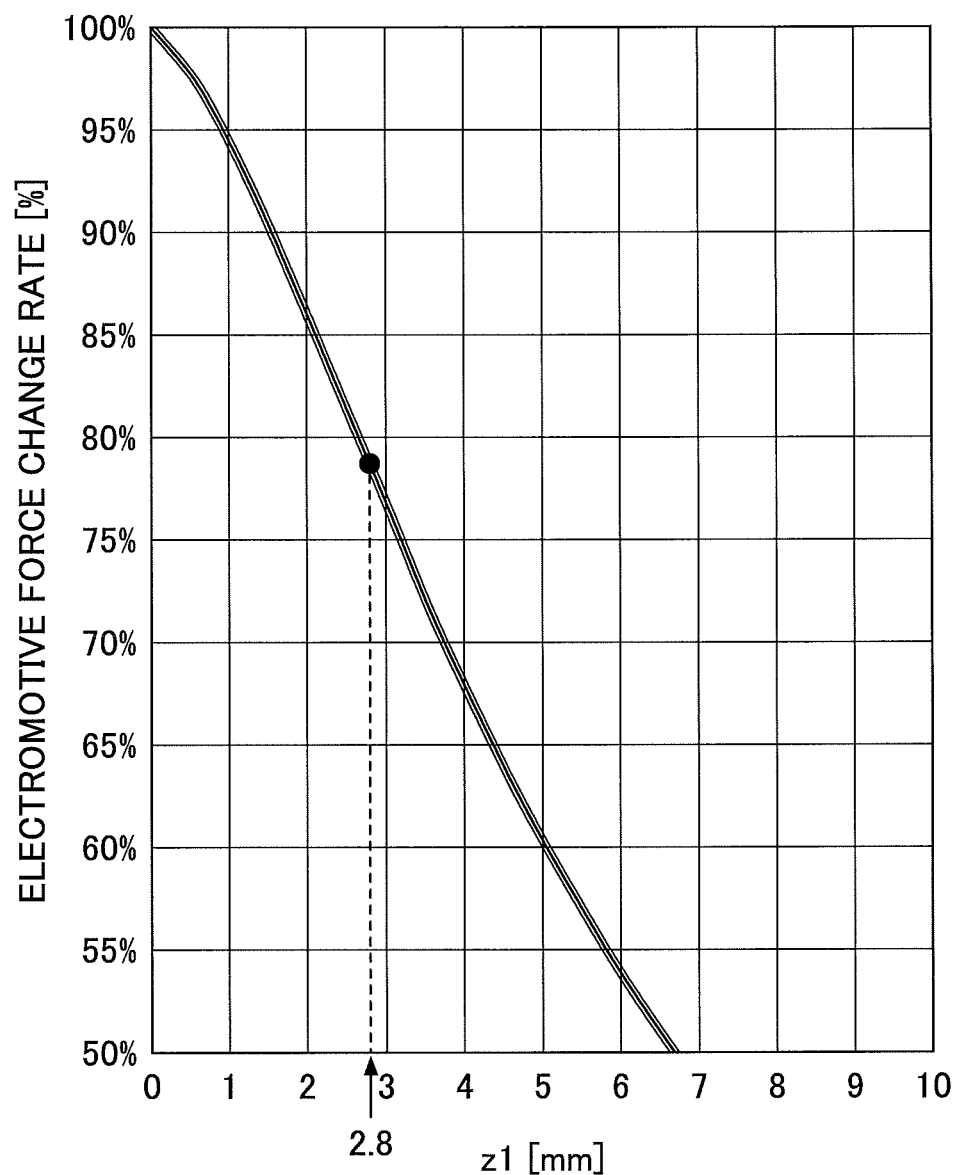
FIG. 9 is a graph of one example of a relationship between an electromotive force change rate and a distance in Z-axis direction between the semiconductor device and the electric wire.

FIG. 9 is a graph of one example of a relationship between the electromotive force change rate and a distance in Z-axis direction between the electric current wire 2 and the semiconductor device 3 or 4. In FIG. 3 and FIG. 9, z1 represents the distance in Z-axis direction between the electric current wire 2 and each of the semiconductor devices 3 and 4. The Z-axis direction represents a direction parallel to the normal direction of the first surface 9. In a case where z1 is 0, the first semiconductor device 3 and the electric current wire 2 are in contact with each other, and the second semiconductor device 4 and the electric current wire 2 are in contact with each other. In a case where z1 takes a value larger than 0, the first semiconductor device 3 and the electric current wire 2 are individually apart from the electric current wire 2 by the same distance in Z-axis direction. In such a case where z1 takes the value larger than 0, the electric current wire 2 does not overlap the first semiconductor device 3 or the second semiconductor device 4, when the surface of the substrate 5 is viewed through from the front side of the substrate 5. Additionally, the electromotive force change rate on the vertical axis of FIG. 9 represents a change rate with respect to the distance z1 of the electromotive force Vcoil generated between both ends of the first inductor 11. In a case where the distance z1 is 0, the electromotive force change rate is assumed to be 100%.

Note that FIG. 9 represents theoretical values of the electromotive force change rate with respect to the distance z1, when the wire diameter of the electric current wire 2 is 3 millimeters. Additionally, it is assumed that the thickness of the substrate 5 is 0.8 millimeters, the height between a bottom surface and the first inductor 11 is 1 millimeter, and the electromotive force Vcoil generated between both ends of the first inductor 11 are the same as electromotive force Vcoil generated between both ends of the second inductor 12.

In the same manner as the first embodiment, as the distance z1 is longer, the electric field noises input into the first and second inductors 11 and 12 of the semiconductor devices 3 and 4 are smaller and the electromotive forces Vcoil are also smaller. In the semiconductor devices 3 and 4 used in the sensor device 1B, however, since bipolar elements are used for amplifying the electromotive forces Vcoil, the flicker noise can be weakened, as will be described later. Therefore, in the second embodiment, even when the electromotive forces Vcoil are made smaller by making each of the semiconductor devices 3 and 4 apart from the electric current wire 2 by at least the given distance L0 (e.g., 3 millimeters), it is possible to eliminate or reduce the possibility that the electromotive force Vcoil cannot be detected correctly due to the existence of flicker noise.

<Circuit Configuration of Sensor Device>

Figure 4:
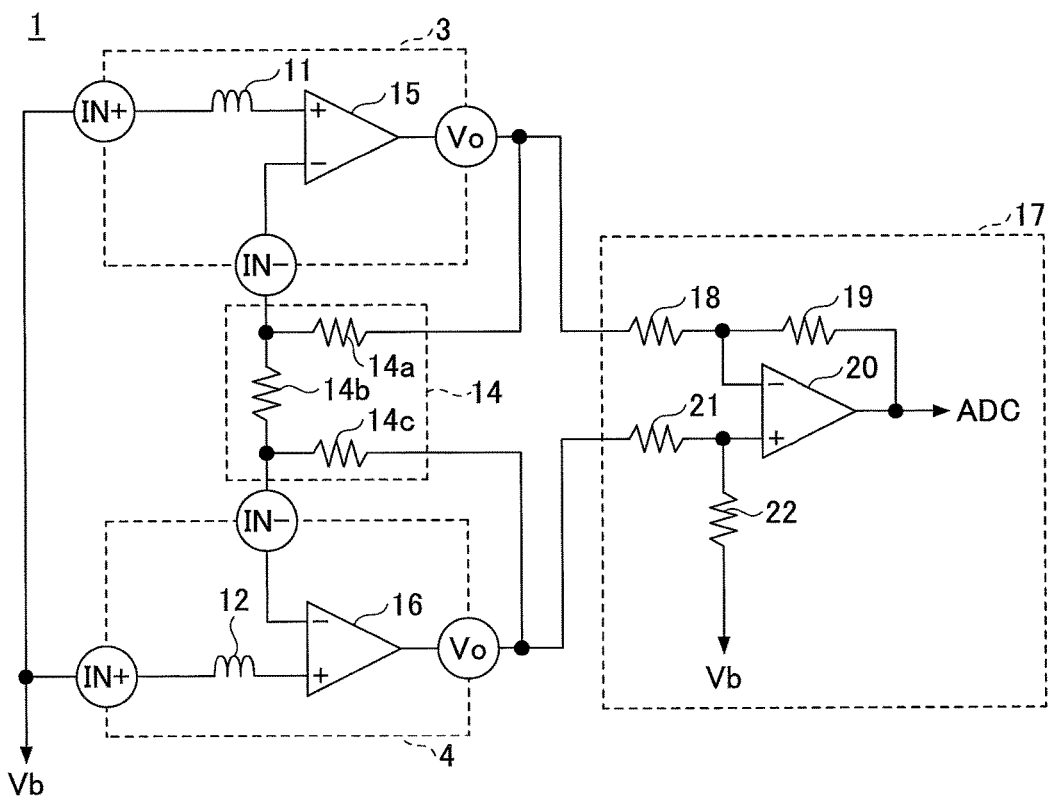
FIG. 4 is an equivalent circuit diagram of one example of a circuit configuration of a sensor device.

FIG. 4 is an equivalent circuit diagram schematically illustrating one example of a circuit configuration of a sensor device 1. The sensor device 1 is one example of the sensor device 1A or the sensor device 1B. The sensor device 1 may include the first semiconductor device 3, the second semiconductor device 4, a feedback resistor 14, and a differential circuit 17. Illustrations of the electric current wire 2 and the substrate 5 are omitted. The feedback resistor 14 and the differential circuit 17 may be mounted on the substrate 5, for example. The feedback resistor 14 may include three resistors 14a, 14b, and 14c.

The first semiconductor device 3 may include the first inductor 11 and a first amplifier 15 configured to amplify a voltage generated at the first inductor 11. The first amplifier 15 may be a Low Noise Amplifier (LNA), for example. The first semiconductor device 3 may include a non-inverting input terminal IN+, an inverting input terminal IN−, and an output terminal Vo, serving as external connection terminals.

A first end of the first inductor 11 is connected through the non-inverting input terminal IN+ to a voltage source of a bias voltage Vb, and a second end of the first inductor 11 is connected to a non-inverting input part of the first amplifier 15. An inverting input part of the first amplifier 15 is connected through the inverting input terminal IN− to a connecting point of a first end of the resistor 14b and a first end of the resistor 14a. An output part of the first amplifier 15 is connected through the resistor 14a to the inverting input part of the first amplifier 15, and is also connected through the output terminal Vo to an inverting input part of the differential circuit 17.

The second semiconductor device 4 includes the second inductor 12 and a second amplifier 16 configured to amplify a voltage generated at the second inductor 12. The second amplifier 16 may be a Low Noise Amplifier (LNA), for example. The second semiconductor device 4 may include a non-inverting input terminal IN+, an inverting input terminal IN−, and an output terminal Vo, serving as external connection terminals.

A first end of the second inductor 12 is connected through the non-inverting input terminal IN+ to the voltage source of the bias voltage Vb, and a second end of the second inductor 12 is connected to a non-inverting input of the second amplifier 16. An inverting input part of the second amplifier 16 is connected through the inverting input terminal IN− to a connecting point of a second end of the resistor 14b and a first end of the resistor 14c. An output part of the second amplifier 16 is connected through the resistor 14c to the inverting input part of the second amplifier 16, and is also connected through the output terminal Vo to a non-inverting input part of the differential circuit 17.

The differential circuit 17 may include resistors 18, 19, 21, and 22, and an operational amplifier 20. The inverting input part of the operational amplifier 20 is connected through the resistor 18 to the output terminal Vo of the first semiconductor device 3. The non-inverting input part of the operational amplifier 20 is connected through the resistor 21 to the output terminal Vo of the second semiconductor device 4. The non-inverting input part of the operational amplifier 20 is also connected through the resistor 22 to a voltage source of the bias voltage Vb. An output terminal of the operational amplifier 20 is connected to the inverting input part of the operational amplifier 20, and is also connected to an Analog-to-digital Converter (ADC) configured to convert analog voltage to digital voltage.

The differential circuit 17 may be a circuit implemented in a microcomputer, or may be a combinational circuit in which a general-purpose operational amplifier 20 and external resistors 18, 19, 21, and 22 are combined. The ADC may be an AD converter implemented in a microcomputer, or may be a general-purpose AD converter. The sensor device 1 is configured to detect the density of magnetic flux generated by the electric current 13 flowing in the electric current wire 2.

<Characteristics of 1/f Noise>

In a case where not only thermal noise of several kHz or higher but also noises in frequency domains (e.g., 50 Hz to 60 Hz) from commercial power sources need to be considered, the reduction of 1/f noises (i.e., flicker noise) in low-frequency domains (e.g., DC to several kHz) is especially demanded.

In one embodiment, the first semiconductor device 3 includes the first amplifier 15 including a bipolar element and the second semiconductor device 4 includes the second amplifier 16 including a bipolar element. In a case where the operational amplifiers (e.g., the first and second amplifiers 15 and 16) are formed by a bipolar process, it is possible to make the 1/f nose smaller than the 1/f noise occurring in a case where the operational amplifiers are formed by a Complementary Metal Oxide Semiconductor (CMOS) process (see FIG. 5).

Figure 5:
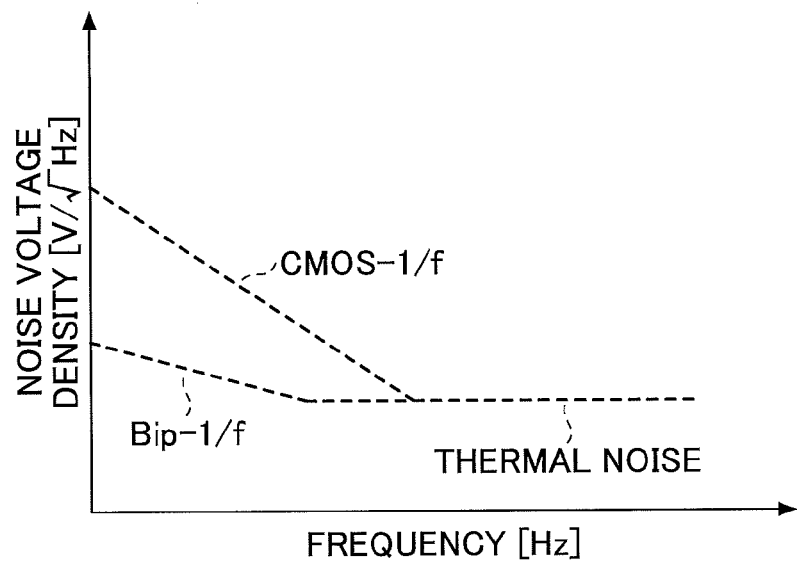
FIG. 5 is a graph indicating one example of noise characteristics.

In FIG. 5, "Bip-1/f" indicates the case where the operational amplifiers are formed by the bipolar process, and "CMOS-1/f" indicates the case where the operational amplifiers are formed by the CMOS process.

As described above, in the case where the operational amplifiers (e.g., the first and second amplifiers 15 and 16) are formed by the bipolar process, the 1/f noise can be weakened. Accordingly, SN ratios of signals that have been amplified by the first and second amplifiers 15 and 16 are improved, and the improved SN ratios are less likely to affect signal processing at the ADC on a subsequent stage.

<Noise Reduction at Inductor>

The first and second inductors 11 and 12 might include resistance components, in a case where the first and second inductors 11 and 12 that are sensor elements include aluminum wiring. Because the resistance components can be sources of thermal noises, the first and second amplifiers 15 and 16 might amplify the thermal noises and might degrade the SN ratios.

In order to prevent the SN ratios from being degraded, purity of the aluminum wiring included in the first and second inductors 11 and 12 can be increased. This enables the reduction of equivalent resistance components in the first and second inductors 11 and 12, and thus prevents the SN ratios from being degraded.

In one embodiment, the first inductor 11 may be formed by the bipolar process in the first semiconductor chip 31 including the first amplifier 15, and the second inductor 12 may be formed by the bipolar process in the second semiconductor chip 32 including the second amplifier 16.

<Reduction of Input Current>

Figure 6:
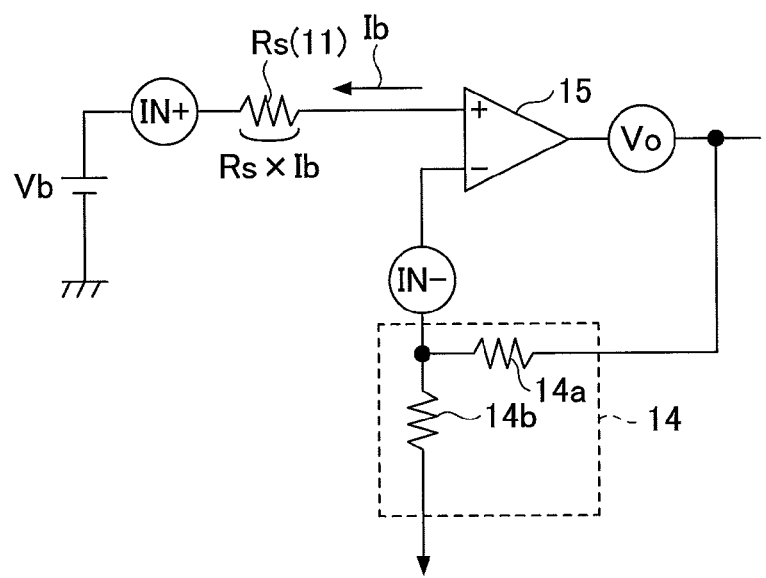
FIG. 6 is a view of one example of a generation mechanism of an input offset.

Since CMOS elements are voltage-driven elements, input impedances of the CMOS elements are very high (e.g., input current reaches several pA). In contrast, since bipolar elements are current-driven elements, bipolar transistors operate when electric current of several nA to hundreds nA is supplied to its bases. In such a manner, the input currents into the bipolar elements are greater than the input currents into the CMOS elements. Hence, a base current Ib that is an input current of a bipolar element flows into a resistance Rs of the inductor, and then an offset voltage (Rs×Ib) is generated between both ends of the resistance Rs (see FIG. 6). This results in an increase in an offset voltage (i.e., input offset voltage $\Delta Vi$) to be input into the first amplifier 15 and an increase in an offset voltage (i.e., output offset voltage $\Delta Vo$) to be output from the first amplifier 15. The same result can also be found at the second amplifier 16.

For example, in a case where the current value of the base current Ib is 100 nA and the resistance value of the resistance Rs is 10 kΩ, an offset voltage $\Delta VRs$ generated between both ends of the resistance Rs is 1 mV. Accordingly, when it is assumed that the amplification degree of the amplifier is 100 times, the output offset voltage $\Delta Vo$ is 100 mV (=1 mV×100).

When the output offset voltage $\Delta Vo$ becomes too high, an output operation point shifts and might affect an input operation range of the ADC.

Figure 7:
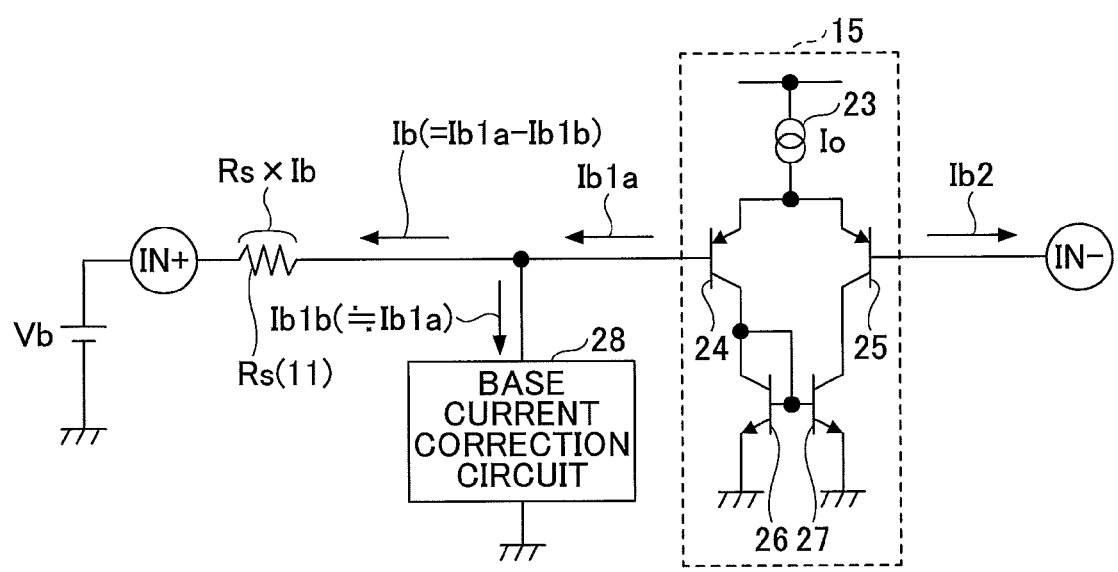
FIG. 7 is an equivalent circuit diagram of one example of a circuit configuration of a semiconductor chip including a base current correction circuit.

In one embodiment, in order to address the above issue, the first semiconductor device 3 may include a first base current correction circuit, and the second semiconductor device 4 may include a second base current correction circuit. FIG. 7 illustrates a first base current correction circuit 28 configured to correct the base current of the first amplifier 15 in the first semiconductor device 3. Note that the second base current correction circuit configured to correct the base current of the second amplifier 16 in the second semiconductor device 4 also has the same configuration and operations as the configuration and operations of the first base current correction circuit 28. Therefore, an illustration of the second base current correction circuit configured to correct the base current of the second amplifier 16 in the second semiconductor device 4 is omitted.

The first base current correction circuit 28 is configured to generate a correction current Ib1b flowing in a direction opposite to a flowing direction of a base current Ib1a of the bipolar transistor included in the first amplifier 15, and is configured to reduce the current Ib flowing across the first inductor 11. The current value of the base current Ib1a can be approximately the same as the current value of the correction current Ib1b. The provision of the first base current correction circuit 28 enables the reduction in the current value of the current Ib flowing across the first inductor 11 to several pA to hundreds pA. Therefore, it is possible to weaken the input offset voltage $\Delta Vi$ into the first amplifier 15, and it is also possible to weaken the output offset voltage $\Delta Vo$ from the first amplifier 15. The same advantages are also available in the second amplifier 16. Consequently, it is possible to prevent shifting of the output operation point of the operational amplifier in the amplifier and it is also possible to prevent the input operation range of the ADC from being affected.

Note that in FIG. 7, the first amplifier 15 may include a constant current source 23, a pair of PNP bipolar transistors 24 and 25 operating as a differential pair, and a pair of NPN bipolar transistors 26 and 27 operating as a current mirror. The constant current source 23 is connected to emitters of the pair of PNP bipolar transistors 24 and 25 to apply a constant current Io to the pair of PNP bipolar transistors 24 and 25. The base current Ib1a is flown into the base of the bipolar transistor 24, and the base current Ib2 is flown into the base of the bipolar transistor 25. Collectors of the pair of PNP bipolar transistors 24 and 25 operating as the differential pair are respectively connected to the pair of NPN bipolar transistors 26 and 27 operating as the current mirror. The second amplifier 16 also has the same configuration as the first amplifier 15.

Heretofore, embodiments of the sensor device, the semiconductor device, and the semiconductor chips have been described, but the present disclosure is not limited to the above-described embodiments. Various variations and modifications may be made without departing from the scope of the present disclosure.

For example, the inductor and the amplifier configured to amplify the voltage generated at the inductor are formed in an identical semiconductor chip, but may be formed in different semiconductor chips.

In addition, regarding the embodiments of the sensor device, the present disclosure is not limited to the case where multiple semiconductor devices are used for detecting the density of magnetic flux in a differential manner. A single semiconductor device may be used for detecting the density of magnetic flux in a single-ended manner. In such a case where the sensor device uses a single semiconductor device for detecting the density of magnetic flux in the single-ended manner, for example, a configuration where the second semiconductor device 4 is omitted from the configuration of FIG. 2 or FIG. 3 is applicable. In this case, the second semiconductor device 4 may be arranged on the substrate 5 to be apart from the electric current wire 2 by at least the distance L0. In a plan view of the substrate 5 (e.g., when the electric current wire 2 is viewed in the normal direction of the first surface 9 of the substrate 5), the electric current wire 2 may be disposed without overlapping the first semiconductor device 3.

What is claimed is:

1. A sensor device comprising:
an electric wire;
a first semiconductor device essentially consisting of a single inductor, a single low noise amplifier (LNA), and output connection terminals, the output connection terminals including a single non-inverting input terminal, a single inverting input terminal, and a single output terminal, the inductor being configured to detect a magnetic field generated around the electric wire, the LNA including a bipolar transistor configured to amplify a voltage generated at the inductor, the non-inverting input terminal being coupled to a non-inverting input of the LNA through the inductor, the inverting input terminal being directly coupled to an inverting input of the LNA, and the output terminal being coupled to an output of the LNA; and
a substrate on which the first semiconductor device and the electric wire are arranged such that the first semiconductor device is apart from the electric wire by a distance that is greater than or equal to 3 mm,
wherein in a plan view of the substrate, the electric wire does not overlap the first semiconductor device.

2. The sensor device according to claim 1, further comprising a second semiconductor device,
wherein the first semiconductor device and the second semiconductor device are arranged on the substrate to be respectively apart from the electric wire by at least the given distance, and
wherein in the plan view of the substrate, the electric wire is disposed between the first semiconductor device and the second semiconductor device without contacting either the first semiconductor device or the second semiconductor device.

3. The sensor device according to claim 1, wherein the first semiconductor device includes a base current correction circuit configured to generate a correction current for flowing in an opposite direction to a direction of a base current of the bipolar transistor included in the LNA, and to reduce an electric current that flows in the inductor.

4. A sensor device comprising:
an electric wire;
a semiconductor device essentially consisting of a single inductor, a single low noise amplifier (LNA), and output connection terminals, the output connection terminals including a single non-inverting input terminal, a single inverting input terminal, and a single output terminal, the inductor being configured to detect a magnetic field generated around the electric wire, the LNA including a bipolar transistor configured to amplify a voltage generated at the inductor, the non-inverting input terminal being coupled to a non-inverting input of the LNA through the inductor, the inverting input terminal being directly coupled to an inverting input of the LNA, and the output terminal being coupled to an output of the LNA; and
a substrate on which the semiconductor device and the electric wire are arranged such that the semiconductor device is apart from the electric wire by a distance than is greater than or equal to 3 mm,
wherein the substrate has a first surface and a second surface opposite to the first surface,
wherein the electric wire is arranged on the first surface,
wherein the semiconductor device is arranged on the second surface, and
wherein the substrate is configured to insulate the semiconductor device from electric field noise emitted from the electric wire.

5. The sensor device according to claim 4, wherein the semiconductor device includes a base current correction circuit configured to generate a correction current for flowing in an opposite direction to a direction of a base current of the bipolar transistor included in the LNA, and to reduce an electric current that flows in the inductor.

6. A semiconductor device essentially consisting of:
a single inductor configured to detect a magnetic field generated around an electric wire;
a single low noise amplifier (LNA) including a bipolar transistor configured to amplify a voltage generated at the inductor; and
output connection terminals including a single non-inverting input terminal, a single inverting input terminal, and a single output terminal, the non-inverting input terminal being coupled to a non-inverting input of the LNA through the inductor, the inverting input terminal being directly coupled to an inverting input of the LNA, and the output terminal being coupled to an output of the LNA,
wherein the semiconductor device is used in a sensor device configured to detect a density of magnetic flux generated by an electric current that flows in the electric wire,
wherein the semiconductor device is arranged to be apart from the electric wire by a distance that is greater than or equal to 3 mm.

* * * * *